United States Patent [19]
Shigemori

[11] Patent Number: 4,942,370
[45] Date of Patent: Jul. 17, 1990

[54] PLL CIRCUIT WITH BAND WIDTH VARYING IN ACCORDANCE WITH THE FREQUENCY OF AN INPUT SIGNAL

[75] Inventor: Toshihiro Shigemori, Yokohama, Japan

[73] Assignee: Ricoh Company, Ltd., Tokyo, Japan

[21] Appl. No.: 333,299

[22] Filed: Apr. 4, 1989

[30] Foreign Application Priority Data

Apr. 8, 1988 [JP] Japan .................................. 63-85156
Jun. 23, 1988 [JP] Japan ................................. 53-153494

[51] Int. Cl.$^5$ ...................... H03L 7/087; H03L 7/093
[52] U.S. Cl. ..................................... 331/1 A; 331/11; 331/14; 331/17; 331/27
[58] Field of Search ..................... 331/1 A, 10, 11, 14, 331/17, 25, 27; 360/37.1, 51

[56] References Cited

U.S. PATENT DOCUMENTS

| | | | |
|---|---|---|---|
| 3,805,183 | 4/1974 | Lance | 331/17 X |
| 4,069,462 | 1/1978 | Dunn | 331/11 |
| 4,404,530 | 9/1983 | Stryer | 331/11 X |
| 4,787,097 | 11/1988 | Rizzo | 331/11 X |

*Primary Examiner*—Siegfried H. Grimm
*Attorney, Agent, or Firm*—Cooper & Dunham

[57] ABSTRACT

A PLL circuit comprises a phase comparator for inputting input and output clock signals and detecting a difference in phase between these both signals and outputting a signal based on the phase difference; a proportional circuit for converting the output signal based on the phase difference from the phase comparator to a first voltage approximately proportional to the phase difference; an integral circuit for converting the output signal based on the phase difference from one of the phase comparator and the proportional circuit to a second voltage approximately proportional to an integral value of the phase difference; and a voltage-controlled oscillator for inputting the first output voltage from the proportional circuit and the second output voltage from the integral circuit, and generating an output clock signal having a frequency controlled by the first and second output voltages. The proportional and integral circuits may be replaced in function by a signal processing circuit for performing predetermined data processing operations according to first and second operating states with respect to the data read operation, and an operational circuit having at least integral characteristics.

8 Claims, 12 Drawing Sheets

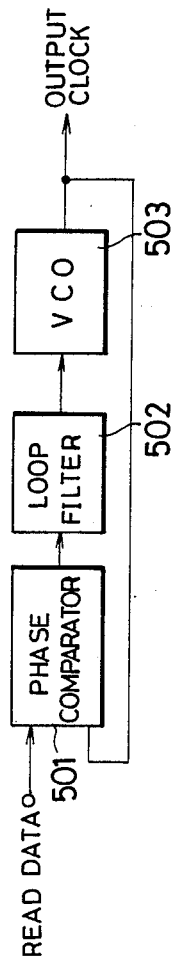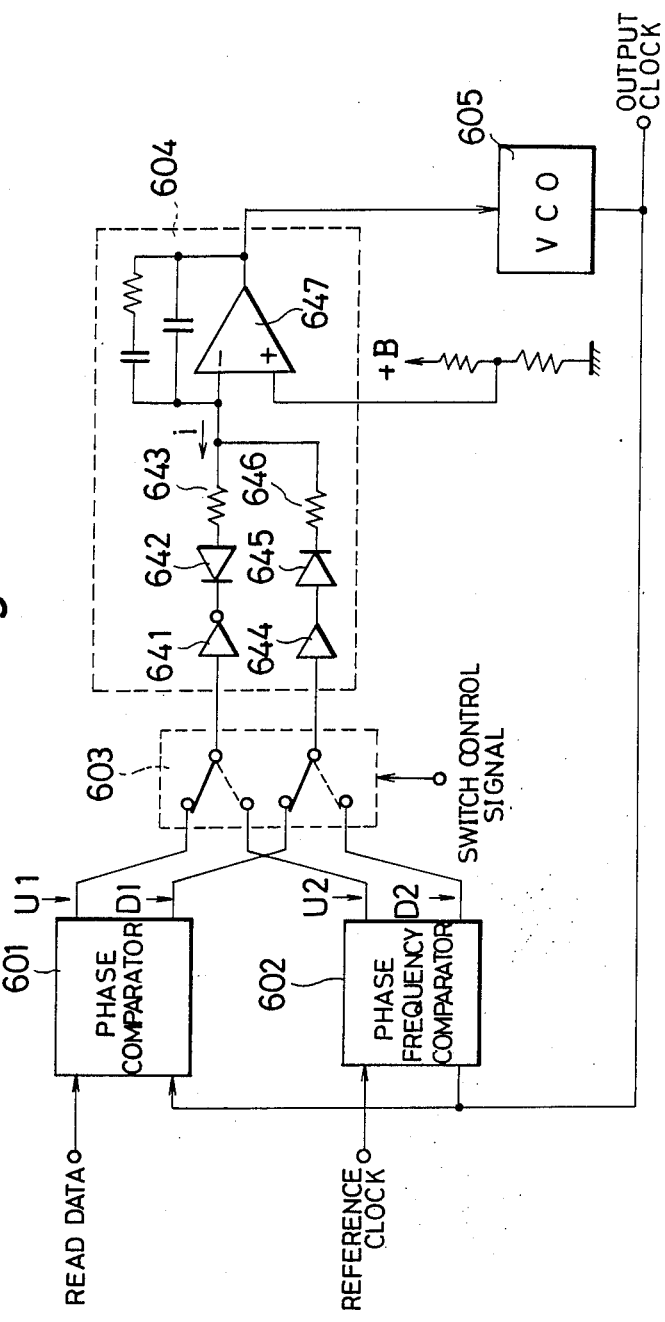
Fig. 1 PRIOR ART
Fig. 2 PRIOR ART

PLL CIRCUIT WITH BAND WIDTH VARYING IN ACCORDANCE WITH THE FREQUENCY OF AN INPUT SIGNAL

BACKGROUND OF THE INVENTION

The present invention relates to a PLL circuit applicable to an optical disk or magnetic disk drive apparatus, etc. More particularly, the present invention relates to a PLL circuit for providing an optical response at any time corresponding to the change in reproducing speed in a wide range thereof. The present invention also relates to a PLL circuit for stabilizing a frequency of an output clock signal in a period in which input read data are lost.

A digital information memory apparatus such as an optical disk or magnetic disk drive apparatus, etc., comprises a PLL (Phase-Locked Loop) circuit for producing a clock signal indicating a reproducing timing for reliably extracting read data when information stored in such an apparatus is reproduced.

Such a PLL circuit has filter characteristics in itself. In this circuit, when a band width, a damping factor, etc., are set to suitable values, dynamic responses to the input read data such as lock time, capture range, characteristics for removing jitter, etc., are different from each other.

Namely, when the band width is set to be wide, the lock time and capture range are improved, by tthe jitter removing characteristics deteriorate. When the band width is set to be narrow, the jitter removing characteristics are improved, but the lock time and the capture range are not improved. Further, when the damping factor is set to be high, the lock time and the capture range are improved, but the jitter removing characteristics deteriorate. When the damping factor is set to be low, the jitter removing characteristics are improved, but the lock time and capture range are not improved.

Accordingly, when the band width, damping factor, etc., are set in the above-mentioned PLL circuit, it is necessary to sufficiently consider the reproducing speed of the input read data and the required lock time, etc.

A recording and reproducing system of an optical disk, where the recording and reproducing speed is changed depending on the radius of a track for increasing a memory capacity, is known. In this system, the recording and reproducing speed is increased as the pickup approaches the outer circumference of the disk in order to record data at a constant density irrespective of a track radius thereby increasing the memory capacity per disk surface. In such a system, the recording and reproducing speed is greatly changed depending on the track radius.

Accordingly, it is necessary to change the dynamic characteristics of the above-mentioned PLL circuit corresponding to the reproducing speed. However, since the band width, damping factor, etc., are fixedly set in the conventional PLL circuit, it is impossible to obtain an optimal response corresponding to all the reproducing speeds from the inner circumference to the outer circumference of the disk.

For example, in the conventional PLL circuit in which the band width is set such that the lock time is optimal with respect to the high reproducing speed (which corresponds to a speed on the outer circumferential side of the disk), the jitter removing characteristics are deteriorate with respect to the low reproducing speed (which corresponds to a speed on the inner circumferential side of the disk) so that the data tend to be read in error.

When the band width is set such that the jitter removing characteristics are optimal with respect to the low reproducing speed, the apparent lock time becomes longer with respect to the high reproducing speed and the number of bits corresponding to the lock time amount becomes greater due to the increased reproducing speed although the lock time is the same in the above both cases. Further, since the period for enabling the data to be really read from the starting operation of the PLL circuit becomes long, for example, repetitious patterns, etc., must be recorded irrespective of the information really required in this period, thereby reducing the memory capacity for use.

Further, in another conventional PLL circuit, in the data read period from the disk, when there are certain defects etc. in the disk, the read data are sometimes lost for a long period such as a period corresponding to about several tens to several hundred bits.

In such a situation, output signals of a phase comparator are held in a disabled state so that an electric current flowing through a loop filter for receiving output signals of the phase comparator is held to be zero. Accordingly, when the above-mentioned filter has ideal integral characteristics, an output voltage from the filter is held to be a constant value, thereby constantly holding the frequency of an output clock signal from a voltage-controlled oscillator operated on the basis of the output signal from the loop filter.

However, in the real circuit construction, the output voltage of the loop filter does not become constant even in the above-mentioned state by an input electric current of an operational amplifier constructing the loop filter or a leak electric current flowing through a diode constructing the loop filter, etc. Therefore, the output voltage of the loop filter is changed in accordance with time in a shape in which the value of the input bias electric current is integrated for example.

Accordingly, even in the read data losing period, the frequency of the output clock signal from the voltage-controlled oscillator is varied and it takes time to obtain the normal phase synchronization even when the read data are normally provided again after the read data losing period has passed. Therefore, the synchronizing operation is performed again in a state in which the input data are lost, i.e., a bit slip is caused so that all the subsequent data are read in error.

SUMMARY OF THE INVENTION

It is therefore an object of the present invention to provide a PLL circuit for obtaining an optimal response corresponding to the change in reproducing speed in a wide range thereof.

Another object of the present invention is to provide a PLL circuit for stabilizing the frequency of an output clock signal in a period in which input read data are lost.

The first object of the present invention can be achieved by a PLL circuit comprising a phase comparator for inputting input and output clock signals and detecting a difference in phase between these both signals and outputting a signal based on the phase difference; a proportional circuit for converting the output signal based on the phase difference from the phase comparator to a first voltage approximately proportional to the phase difference; an integral circuit for converting the output signal based on the phase difference from one of the phase comparator and the proportional circuit to a second voltage approximately proportional to an integral value of the phase difference; and a voltage-controlled oscillator for inputting the first output voltage from the proportional circuit and the second output clock signal having a frequency controlled by the first and second output voltages.

In accordance with this structure of the present invention, a band width is varied approximately in proportion to a reproducing speed while a damping factor is approximately held constant, thereby providing optimal dynamic characteristics corresponding to the change in reproducing speed in a wide range thereof.

The second object of the present invention can be achieved by a PLL circuit comprising a phase comparator for detecting a first difference in phase between an input signal and an output clock signal and generating an output signal corresponding to the first phase difference; a signal processing circuit for detecting a second difference in phase between the output clock signal and a reference clock signal having a predetermined frequency, and performing data processings by using the second phase difference according to first and second operating states with respect to the data read operation on the basis of a switch control signal; a gate circuit for controlling the transmission of the output signal from the phase comparator in accordance with the first and second operating states on the bases of the switch control signal; a converter for converting the output data from the signal processing circuit to an analog voltage signal; an operational circuit for performing at least an integral operation with respect to the output voltage signal from the converter and a voltage signal approximately proportional to the first phase difference generated on the basis of the output signal from the phase comparator through the gate circuit; and a voltage-controlled oscillator for generating the output clock signal having a frequency controlled on the basis of the output voltage from the operational circuit.

In a period execpt for the period in which the data are read from a disk, the output signal from the phase comparator is disabled and the output voltage from the signal processing circuit for outputting digital data corresponding to the second phase difference between the reference clock and output clock signals is converted to the analog voltage and supplied to a loop filter. Accordingly, the frequency of the output clock signal from the voltage-controlled oscillator is used as the predetermined reference frequency and is held constantly.

Further objects and advantages of the present invention will be apparent from the following description of the preferred embodiments of the present invention as illustrated in the accompanying drawings.

BRIEF DESCRIPTION OF THE DRAWINGS

FIG. 1 is a constructional view of a prior art PLL circuit;

FIG. 2 is a constructional view showing another prior art PLL circuit;

DESCRIPTION OF THE PREFERRED EMBODIMENTS

Figure 3:
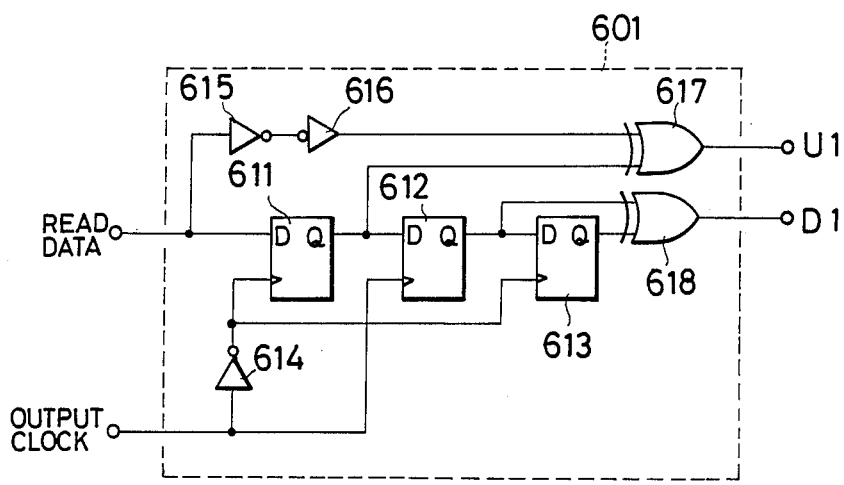
FIG. 3 is a view showing a constructional example of a phase comparator of the another prior art PLL circuit.

The preferred embodiment of a PLL circuit of the present invention will now be described in detail with reference to the accompanying drawings.

FIG. 1 is a view showing the construction of a prior art PLL circuit. The PLL circuit comprises phase comparator 501 for comparing the phase of an imput read data signal and an output clock signal with each other and outputting a signal proportional to the difference in phase therebetween, loop filter 502 for outputting a voltage signal provided by adding a value proportional to the output from phase comparator 501 and a value obtained by the integration of the proportional value, and voltage-controlled oscillator (VCO) 503 for generating an output clock signal having a frequency approximately proportional to the output voltage from loop filter 502. This circuit is operated such that the phase of the output clock signal from the above-mentioned voltage-controlled oscillator 503 follows the phase of the read data signal as an input signal.

FIG. 2 shows a constructional example of another PLL circuit generally used in which the phase of an output clock signal follows the phase of an input read data signal.

In FIG. 2, phase comparator 601 compares the phases of the input read data signal and the output clock signal with each other and detects a difference in phase between these signals. Phase frequency comparator 602 detects differences in phase and frequency between a reference clock signal having a fixed frequency and the output clock signal. Change-over switch 603 is switched and controlled on the basis of a switch control signal. in a period in which data are read from a disk, change-over switch 603 is switched on the solid line side and thereby selectively outputs output signals U1 and D1 from phase comparator 601. In a period except for the above data read period, change-over switch 603 is switched on the broken line side and thereby selectively outputs output signals U2 and D2 from phase frequency comparator 602.

Loop filter 604 performs a smoothing operation with respect to output signals U1, D1 or U2, D2 from phases comparator 601 or phase frequency comparator 602 and generates a voltage provided by adding a voltage component approximately proportional to the phase difference and a voltage component approximately proportional to an integral value of the phase difference. Voltage-controlled oscillator (VCO) 605 makes the phase of the output clock signal to follow the phase of the read data signal or reference clock signal based on the output voltage from loop filter 604.

As shown in FIG. 3, phase comparator 601 is constructed by D-type flip flops 611, 612, 613, inverters 614, 615, 616, and exclusive OR circuits 617, 618. The output clock signal shown in FIG. 4(b) and provided from voltage-controlled oscillator 605 shown in FIG. 2 is supplied to a clock terminal of flip flop 612. A clock signal provided by inverting the above output clock signal through inverter 614 is supplied to respective clock terminals of flip flops 611 and 613.

Figure 4:
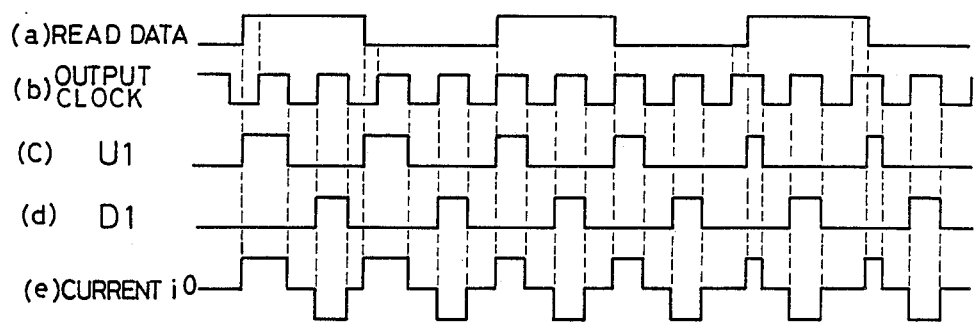
FIG. 4 is a timing chart for explaining the operation of the above phase comparator.

The input read data signal shown in FIG. 4(a) is supplied to a data terminal of flip flop 611. A Q-output of flip flop 611 is supplied to a data terminal of flip flop 612 and a Q-output of flip flop 612 is supplied to a data terminal of flip flop 613.

The Q-output from flip flop 611 and the input read data signal provided through inverters 615, 616, as an output from phase comparator 601 are supplied to exclusive OR circuit 617. Exclusive OR circuit 617 performs an exclusively logic sum operation with respect to these both signals, and outputs output signal U1 shown in FIG. 4(c). The Q-outputs from flip flops 612 and 613 are supplied to exclusive OR circuit 618. Exclusive OR circuit 618 performs an exclusively logic sum operation of these both signals and outputs output signal D1 shown in FIG. 4(d).

Electric current i shown in FIG. 4(e) is an electric current flowing through loop filter 604 based on output signals U1, D1 supplied from phase comparator 601 through the solid line side of change-over switch 603 in the period in which the data are read from the disk.

Figure 5:
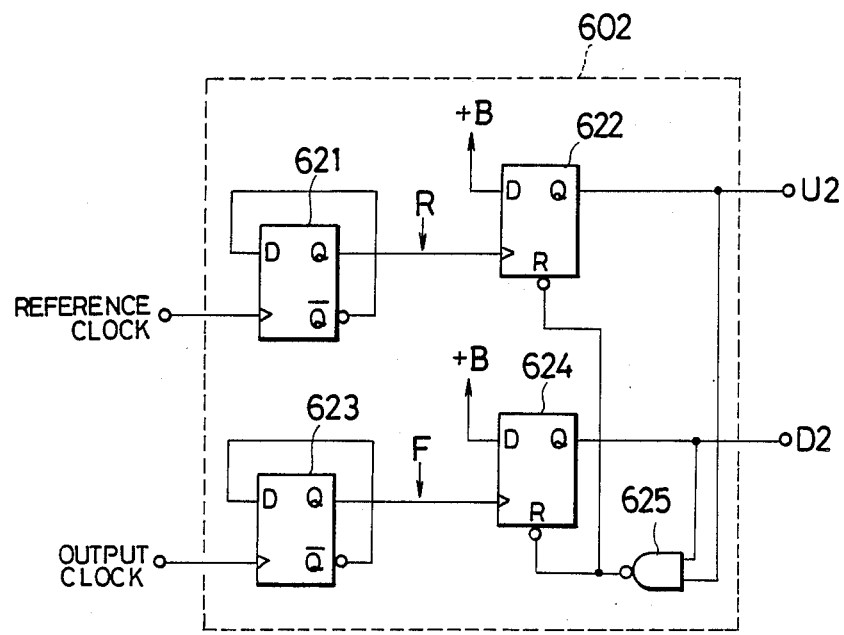
FIG. 5 is a veiw showing a constructional example of a phase frequency comparator of the another prior art PLL circuit.

As shown in FIG. 5, phase frequency comparator 602 is constructed by D-type flip flops 621 to 324 and NAND gate 625. & The above-mentioned reference clocks signal is supplied to the clock terminal of flip flop 621 in which data and $\overline{Q}$ output terminals are connected to each other. The Q-output from flip flop 621 is supplied to a clock terminal of flip flop 622 and output signal U2 is outputted from a Q-output of flip flop 622. The output clock signal from voltage-controlled oscillator 605 is supplied to a clock terminal of flip flop 623 in which data and $\overline{Q}$ output terminals are connected to each other. The Q-output from flip flop 623 is supplied to a clock terminal of flip flop 624 and output signal D2 is outputted from a Q-output of flop flop 624.

With respect to flip flops 622 and 624, the data terminals are fixedly at "H" level in voltage at any time, and signals provided through NAND gate 625 with respect to the above output signals U2, D2 are supplied to reset terminals to perform a reset operation.

Figure 6:
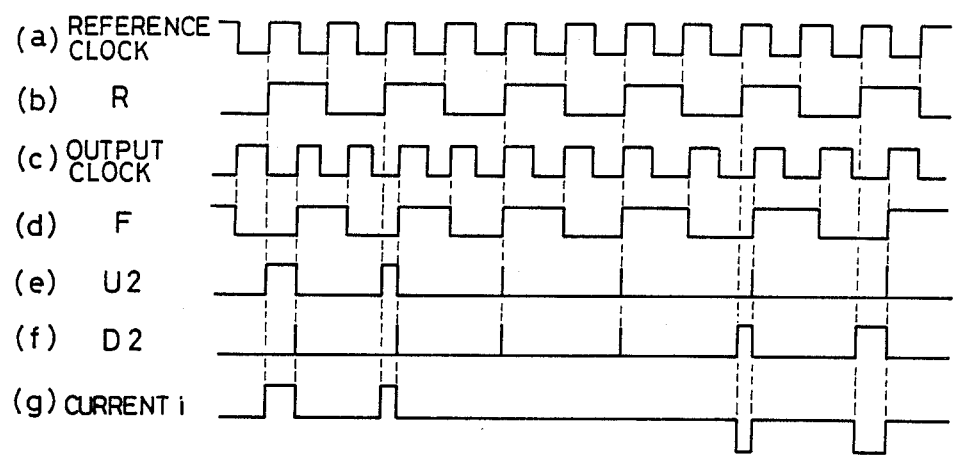
FIG. 6 is a timing chart for explaining the operation of the above phase frequency comparator.

The reference clock signal having a fixed frequency shown in FIG. 6(a) is supplied to the clock terminal of the above flip flop 621, and signal R shown in FIG. 6(b) is outputted from the Q-output of flip flop 621. Signal R is supplied to the clock terminal of flip flop 622 and output signal U2 shown in FIG. 6(e) is outputted from the Q-output of flip flop 622. Output clock signal shown in FIG. 6(c) and provided from voltage-controlled oscillator 605 is supplied to the clock terminal of flip flop 623 and signal F shown in FIG. 6(d) is outputted from the Q-output of flip flop 623. Signal F is supplied to the clock terminal of flip flop 624 and output signal D2 shown in FIG. 6(f) is outputted from the Q-output of flip flop 624.

Electric current i shown in FIG. 6(g) is an electric current flowing through loop filter 604 based on output signals U2, D2 supplied from phase frequency comparator 602 through the broken line side of change-over switch 603 in the period except for the above-mentioned period in which the data are read from the disk.

In the above-mentioned construction, in the period in which the data are read from the disk, change-over switch 603 is switched to the solid line side based on the switch control signal. In this data read period, output signal U1 from phase comparator 601 is supplied to through inverter 641, diode 642 and resistor 643 to inverted input terminal "−" of operational amplifier 647 in which a reference voltage is supplied to non-inverted inout terminal "+". In this data read period, output signal D1 is further supplied to inverted input terminal "−" of operational amplifier 647 through buffer 644, diode, 645 and resistor 646.

Change-over switch 603 is switched to the broken line side on the basis of the above-mentioned switch control signal in the period except for the period in which the data are read from the disk. e.g., in a period in which required imformation are accessed to a stored track, or in a period in which the data are written to the disk, etc. At this time, since the output clock signal of voltage-controlled oscillator 605 is set to have a reference frequency and this state is held, output signal U2 from phase frequency comparator 602 is supplied to inverted input terminal "−" of operational amplifier 647 through inverter 641, diode 642 and resistor 643. Further, output signal D2 is supplied to inverted input terminal "−" of operational amplifier 647 through buffer 644, diode 645 and resistor 646.

The above-mentioned loop filter 604 performs the smoothing operation with respect to output signals U1, D1 and U2, D2 selectively supplied from phase comparator 601 or phase frequency comparator 602 through change-over switch 603. Thus, loop filter 604 generates a voltage provided by adding a voltage component approximately proportional to the difference in phase of signals U1, D1 and U2, D2 and a voltage component approximately proportional to an integral value of this phase difference. The output voltage thus added is supplied as a control signal to voltage-controlled oscillator 605. Voltage-controlled oscillator 605 generates and outputs an output clock signal having a frequency controlled on the basis of the above-mentioned output voltage from loop filter 604.

Figure 7:
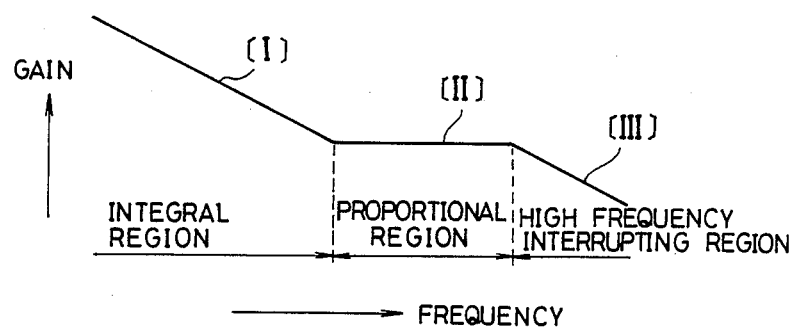
FIG. 7 is a view for showing the frequency characteristics of a prior art loop filter.

FIG. 7 shows the frequency characteristics of a prior art loop filter generally consisting of integral region I, proportional region II and high frequency interrupting region III based on the gain with respect to frequency.

Figure 8:
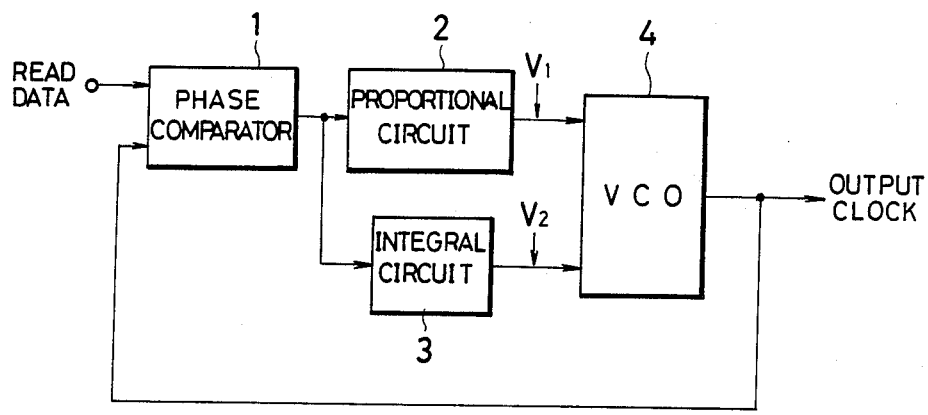
FIG. 8 is a basically constructional view of a PLL circuit in accordance with the present invention.

FIG. 8 is a basically constructional view of a PLL circuit in accordance with the present invention. This circuit comprises phase comparator 1 for comparing the phases of an input read data signal and an output clock signal with each other and outputting a signal proportional to the difference in phase therebetween, and proportional circuit 2 for generating voltage $V_1$ approximately proportional to the phase-comparing output from phase comparator 1. This circuit further comprises integral circuit 3 for generating voltage $V_2$ proportional to an approximately integral value of the phase-comparing output from phase comparator 1, and voltage-controlled oscillator (VCO) 4 for imputting voltage $V_1$ from proportional circuit 2 and voltage $V_2$ from integral circuit 3 and generating an output clock signal having a frequency controlled by these voltage values.

In the above-mentioned voltage-controlled oscillator 4 of the present invention, a voltage-controlled oscillator having two inputs is used and relation between two input voltages $V_1$, $V_2$ and Frequency $F_0$ of the output clock signal is approximately represented by the following formula (1).

$$F_0(V_1, V_2) = \frac{1}{a} \frac{V_1 + b}{V_2 + c} \quad (1)$$

Here, values a, b and c in the above formula (1) are respectively constant.

Figure 15:
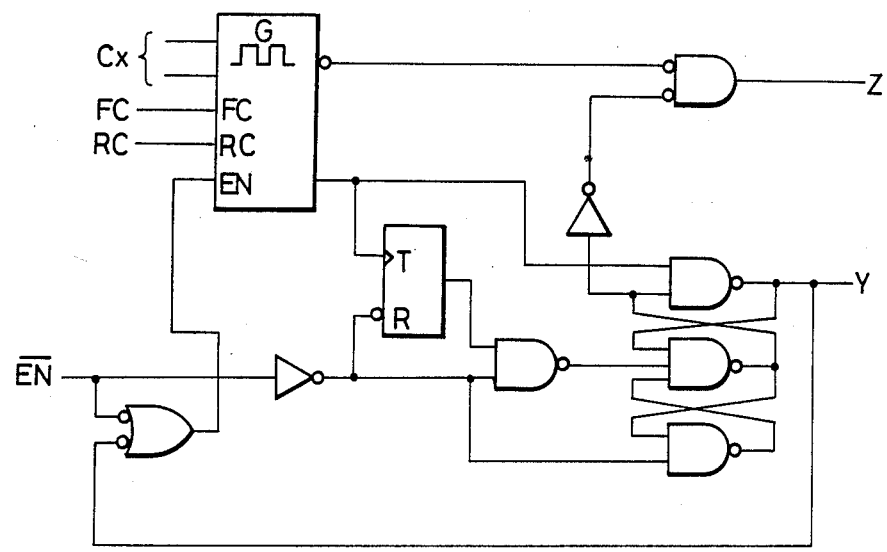
FIG. 15 is a constructional block diagram showing an example of voltage-controlled oscillator used in the present invention.

The voltage-controlled oscillator having the characteristics approximately represented by formula (1) may be constructed by each of products of serial numbers SN74LS624, 628, 629, etc., manufactured by Texas Instruments corporation as shown in the constructional block diagram of FIG. 15 for example. The characteristics approximately represented by formula (1) are obtained in such circuits when the voltage of an FC terminal of each of these circuits is set to $V_1$ and the voltage of an RC terminal thereof is set to $V_2$.

Figure 9A:
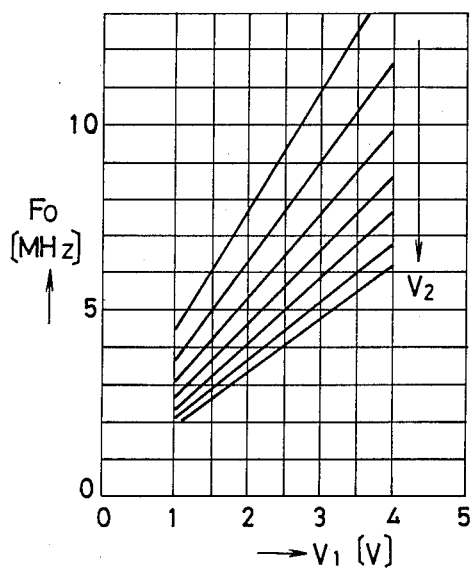
FIGS. 9a and 9b are views showing the characteristics of output frequencies with respect to input voltages of a voltage-controlled oscillator in the present invention.
Figure 9B:
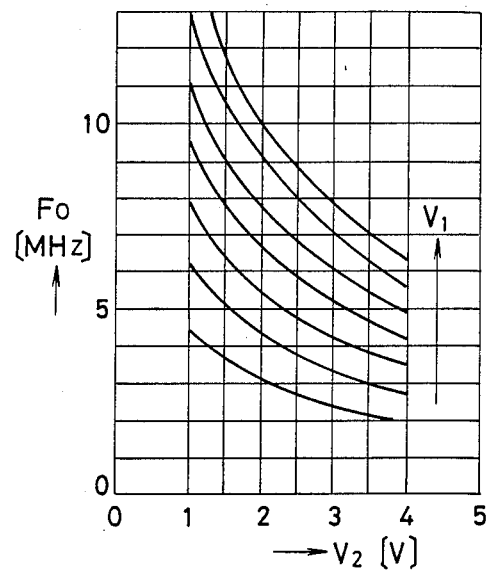

FIGS. 9a and 9b illustrate examples of the characteristics between the input voltage and the output frequency showing the relation of formula (1). FIG. 9a shows the relation between input voltage $V_1$, $V_2$ and frequency $F_0$ of the output clock signal when voltage $V_2$ is a parameter. FIG. 9b shows this relation when voltage $V_1$ is a parameter.

Proportional circuits 2 of FIG. 8 outputs voltage $V_1$ approximately proportional to the phase-comparing output between the read data signal and the output voltage $V_2$ porportional to the approximately integral value of the above phase-comparing output. Here, operating reference voltages of proportional circuit 2 and integral circuit 3 are set to $V_{10}$. Namely, the output of proportional circuit 2 is $V_{10}$ when the phase difference is 0, and at this time integral circuit 3 integrates voltage difference $V_1-V_{10}$.

When the output frequency of voltage-controlled oscillator 4 is set to $f_0$ and the PLL circuit is operated in a steady state, the difference in phase of the output of phase comparator 1 is 0. and operating point $v_1$ of voltage $V_1$ is provided by the following formula, $$v_1 = V_{10} \quad (2).$$

From the above formulas (1) and (2), operating point $v_2$ of voltage $V_2$ is provided by the following formula, $$V_2 = \frac{1}{a} \frac{V_{10} + b}{f_0} - C \quad (3)$$

Further, from the above formula (1), sensitivities of output frequency $F_0$ of voltage-controlled oscillator 4 are represented as follows with respect to voltages $V_1$ and $V_2$, respectively.

$$\frac{\partial F_0(V_1, V_2)}{\partial V_1} = \frac{1}{a} \frac{1}{V_2 + C} \quad (4)$$

$$\frac{\partial F_0(V_1, V_2)}{\partial V_2} = -\frac{1}{a} \frac{V_1 + b}{(V_2 + C)^2} \quad (5)$$

Accordingly, when the PLL circuit is operated in the steady state at output frequency $f_0$ of voltage-controlled oscillator 4 from the operating points of voltage $V_1$ and $V_2$ in the steady state obtained by the above formulas (2) and (3), the sensitivities of output frequency $F_0$ of voltage-controlled oscillator 4 with respect to voltage $V_1$ and $V_2$ are respectively represented by the following formulas, $$\frac{\partial F_0(V_1, V_2)}{\partial V_1} = \frac{f_0}{V_{10} + b} \quad (6)$$

$$\frac{\partial F_0(V_1, V_2)}{\partial V_2} = -\frac{af_0^2}{V_{10} + b} \quad (7)$$

The above formula (6) shows that the sensitivity of output frequency $F_0$ of voltage-controlled oscillator 4 with respect to output voltage $V_1$ from proportional circuit 2 is changed in proportion to output frequency $f_0$. Formula (7) shows that the sensitivity of output frequency $F_0$ of voltage-controlled oscillator 4 with respect to output voltage $V_2$ from integral circuit 3 is changed in proportion to the second power of output frequency $f_0$.

Figure 10:
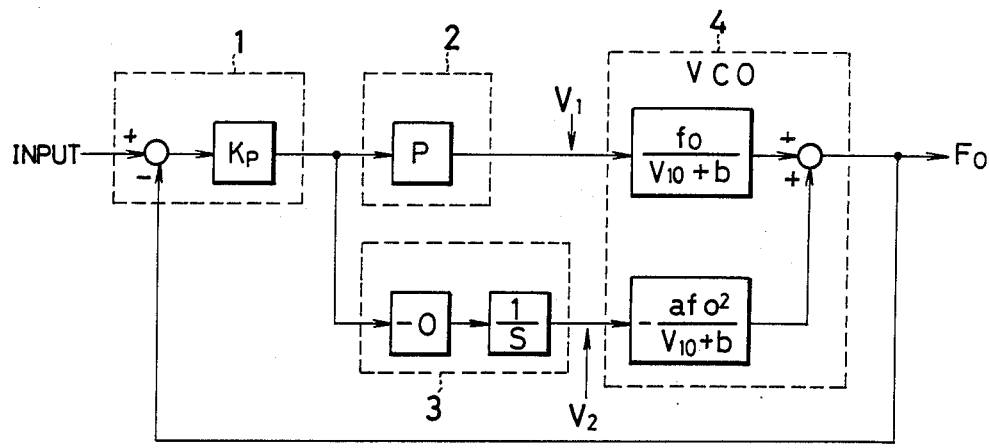
FIG. 10 is a block diagram of the PLL circuit in accordance with the present invention.

Accordingly, the block diagram of the PLL circuit in accordance with the present invention is represented as in FIG. 10 when this circuit is operated at output frequency $f_0$. in FIG. 10, reference numeral $K_p$ is a sensitivity in phase comparator 1, P a gain in proportional circuit 2, and reference numerals 0 and S respectively show a gain of integral circuit 3 and a Laplace operator in an integral system.

Figure 11:
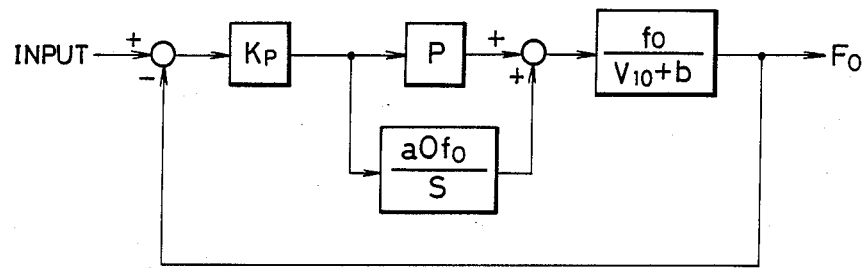
FIG. 11 is an equivalent block diagram obtained by an equivalent conversion from the block diagram of FIG. 10.
Figure 12:
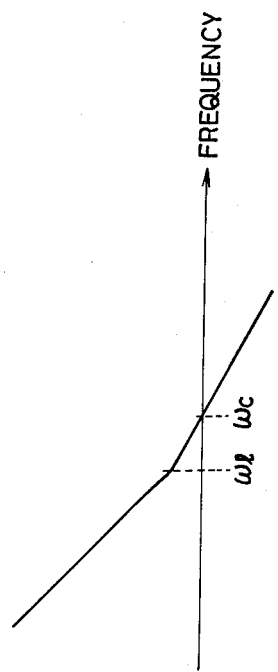
FIG. 12 is a view showing an open loop gain characteristic of the PLL circuit in accordance with the present invention.

The block diagram shown in FIG. 10 can be rewritten in a simplified shape shown in FIG. 11 on the basis of an equivalent conversion of this block diagram. From the equivalent block diagram shown in FIG. 11, the gain characteristics of an open loop of the PLL circuit are provided as shown in FIG. 12. In FIG. 12, reference numeral $\omega_c$ designates a cross frequency in the open loop gain characteristics and reference numeral $\omega_1$ designates a zero-point frequency in the open loop gain characteristics.

When cross frequency $\omega_c$ in the above open loop gain characteristics is greater than zero-point frequency $\omega_1$ therein, these frequencies are approximately respectively represented by the following formulas, $$\omega_c = \frac{K_p P f_0}{V_{10} + b} \quad (8)$$

-continued $$\omega_1 = \frac{aQf_0}{P} \quad (9)$$

Namely, as can be seen from the above formulas (8) and (9), in the PLL circuit of the present invention, cross frequency $\omega_c$ and zero-point frequency $\omega_1$ in the open loop gain characteristics are respectively changed in proportion to operating frequency $f_0$ of voltage-controlled oscillator 4 while the ratio between cross frequency $\omega$hd c and zero-point frequency $\omega_1$ is held constantly. Accordingly, a band width is changed in proportion to the reproducing speed while a damping factor in the PLL circuit is held constantly.

Thus, in accordance with the present invention, it is possible to construct the PLL circuit having optimal dynamic characteristics at any time even when the reproducing speed is changed in a wide range thereof.

Figure 13:
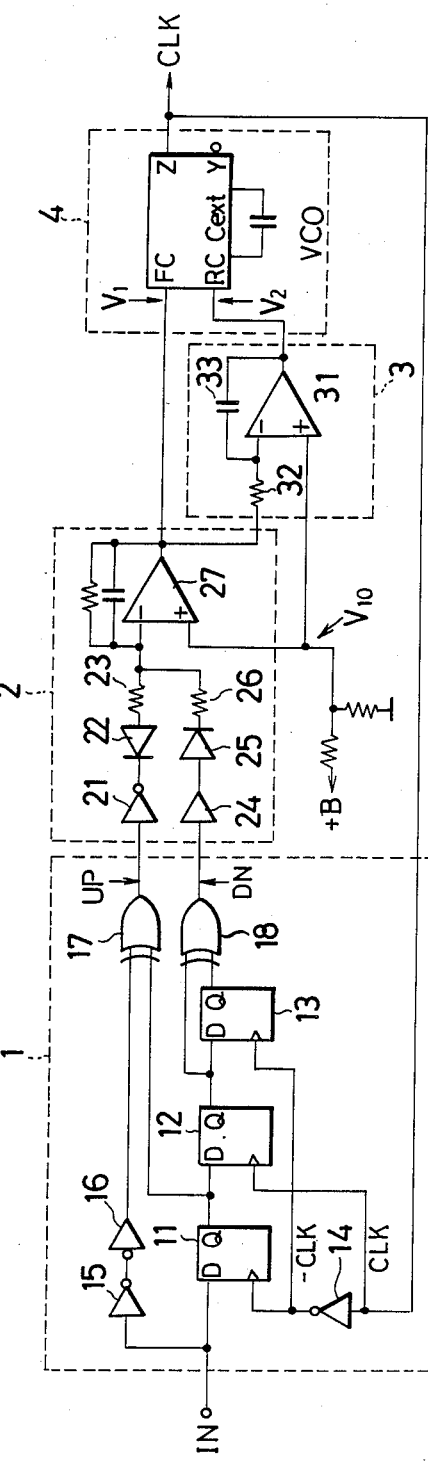
FIG. 13 is a detailed constructional view showing an embodiment of the present invention.

FIG. 13 is a constructional view showing a further detailed embodiment based on the construction of the PLL circuit of the present invention shown in FIG. 8.

In FIG. 13, phase comparator 1 is constructed by D-type flip flops 11, 12, 13, inverters 14, 15, 16 and exclusive OR circuits 17, 18. Output clock signal CLK from voltage-controlled oscillator 4 is supplied to a clock terminal of flip flop 12. Clock-signal - CLK is obtained by inverting the above output clock signal CLK through inverter 14 and is supplied to clock terminals of flip flops 11 and 13.

Read data signal IN and input signal is supplied to a data terminal of flip flop 11. A Q-output of flip flop 11 is supplied to a data terminal of flip flop 12 and a Q-output of flip flop 12 is supplied to a data terminal fo flip flop 13.

Input read data signal IN is supplied through inverters 15 and 16 to a first input of exclusive OR circuit 17; and the Q-output from flip flop 11 is supplied to a second input of exclusive OR circuit 17. Exclusive OR circuiit 17 performs an exclusively logic sum operation of these both signals and output a UP signal as shown in FIG. 13. Further, the Q-outputs from flip flops 12 and 13 are supplied to exclusive OR circuit 18. Exclusive OR circutt 18 performs an exclusively logic sum operation of these both signals and outputs a DN signal as shown in FIG. 13.

Proportional circuit 2 is constructed by inverter 21, buffer 24, diodes 22, 25, resistors 23, 26 and operational amplifier 27. The UP signal from exclusive OR circuit 17 of phase comparator 1 is supplied to inverted input terminal "—" of operational amplifier 27 through inverter 21, diode 22 and resistor 23. The DN signal from exclusive OR circuit 18 of phase comparator 1 is also supplied to the above inverted input terminal "—" of operational amplifier 27 through buffer 24, diode 25 and resistor 26. Operational reference voltage $V_{10}$ is suplied to non-inverted input terminal "+" of operational amplifier 27.

Proportional circuit 2 performs a smoothing operation with respect to output pulses of the UP and DN signals from phase compatator 1 so as to output a voltage proportional to the difference in pulse width between the two output UP and DN signals from phase comparator 1. Accordingly, the output voltage from proportional circuit 2 becomes a voltage proportional to this phase difference. Output voltage $V_1$ proportional to the above phase difference from proportional circuit 2 is supplied to the FC terminal as one input of voltage-controlled oscillator 4 from the output of operational amplifier 27 and is supplied to integral circuit 3.

Integral circuit 3 is constructed by operational amplifier 31, resistor 32 and capacitor 33. The above input voltage $V_1$ from proportional circuit 2 is supplied through resistor 32 to inverted input terminal "—" of operational amplifier 31, and operating reference voltage $V_{10}$ is supplied to non-inverted input terminal "+" of operational amplifier 31.

Integral circuit 2 integrates output voltage $V_1$ from proportional circuit 2 and outputs a voltage proportional to an integral value of the phase difference. Output voltage $V_2$ proportional to the integral value of the above phase difference from integral circuit 3 is supplied to the RC terminal as a second input of voltage-controlled oscillator 4 from the output of operational amplifier 31.

The above voltage-controlled oscillator 4 may be constructed by each of products of serial numbers SN74LS624, 628, 629, etc., manufactured by Texas Instruments corporation as mentioned before, and the characteristics of voltage-controlled oscillator 4 are represented by the above-mentioned formula (1).

Output voltage $V_1$ from proportional circuit 2 and output voltage $V_2$ from integral circuit 3 are respectively supplied to the FC and RC terminals of voltage-controlled oscillator 4. Voltage-controlled oscillator 4 generates and outputs an output clock signal having a frequency controlled by voltages $_1$ and $V_2$.

Figure 14A:
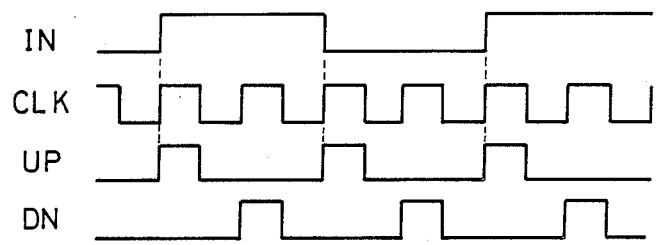
FIGS. 14a to 14c are timing charts for explaining the operation of a phase comparator in the present invention.
Figure 14B:
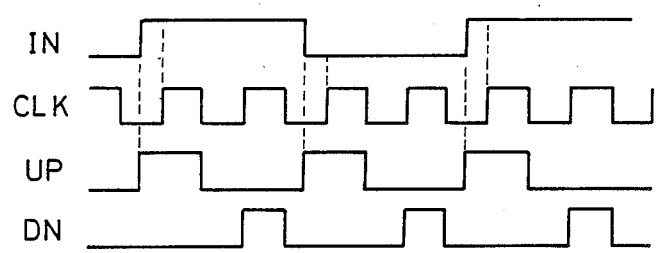
Figure 14C:
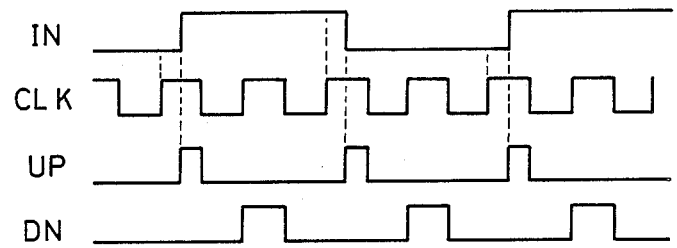

FIGS. 14a to 14c are timing charts showing the operation of phase comparator 1 shown in FIG. 13.

As shown in FIG. 14a, when the phases of input or read data signal IN and output clock signal CLK are in conformity with each other, the pulse widths of UP and DN signals as output signals from phase comparator 1 become same. As shown in FIG. 14b, when the phase of output clock signal CLK is delayed with respect to input or read data signal IN, the pulse width of the UP signal is wider than the pulse width of the DN signal. In contrast to this, as shown in FIG. 14c, when the phase of output clock signal CLK is advanced with respect to input or read data signal IN, the pulse width of the UP signal is narrower than that of the DN signal.

With respect to the characteristics of voltage-controlled oscillator 4 in the above-mentioned embodiment, it is not necessary that such characteristics strictly meet formula (1) even in the case of any values of voltage $V_1$ and $V_2$ from proportional circuit 2 and integral circuit 3. The effects of the present invention can be sufficiently provided when there is a relation approximately meeting formula (1) in the range of the used output frequency and in the range of the input voltage obtained by formulas (2) and (3).

As mentioned above, in accordance with the present invention, the frequency of the output clock signal is controlled by a voltage value approximately proportional to the phase-comparing output and a voltage value approximately proportional to the integral value of the phase-comparing output. Accordingly, the band width can be automatically varied by a simplified circuit construction with respect to the reproducing speed in a wide range thereof so that optimal dynamic characteristics can be obtained at any time corresponding to the change in reproducing speed in a wide range.

Figure 16:
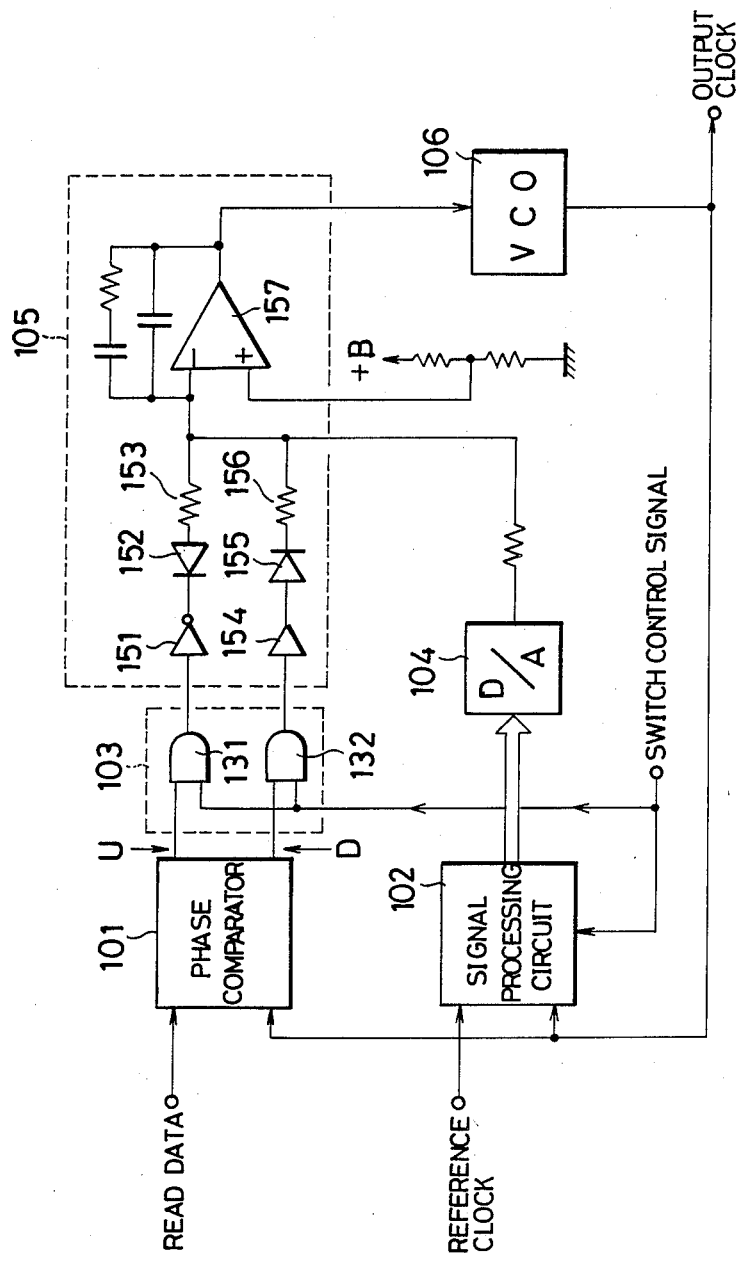
FIG. 16 is a constructional view of the PLL circuit in accordance with a second embodiment of the present invention.

FIG. 16 is a constructional view of the PLL circuit in a second embodiment of the present invention.

In FIG. 16, phase comparator 101 detects a first difference in phase between an input read data signal and an outout clock signal. Signal processing circuit 102 detects a second difference in phase between the output clock and a reference clock signal having a fixed frequency predetermined in advance, and generates a data signal corresponding to the second phase difference in a data read period or second state in which data are read from the disk on the basis of a switch control signal. Signal processing circuit 102 holds an approximately average value of the output data provided just before in a period or first state except for the data read period and is constructed by e.g., a digital signal processor(which is called DSP in the following description).

Gate circuit 103 is constructed by AND gates 131, 132 for disabling output signals U, D from phase comparator 101 in the first state on the basis of the above switch control signal, and passing therethrough these output signals in the second state. D/A converter 104 converts the output voltage of signal processing circuit 102 to an analog voltage. Loop filter 105 performs a smoothing operation with respect to output signals U, D from phase comparator 101 through gate circuit 103, and this smoothing operation is performed through inverter 151, diode 152, resistor 153 and buffer 154, diode 155, resistor 156. In loop filter 105, operational amplifier 157 performs a processing for approximately providing integral characteristics with respect to a voltage component approximately proportional to the above first phase difference and the output voltage supplied from D/A converter 104. Voltage-controlled oscillator 106 generates an output clock signal having a frequency controlled on the basis of the output voltage from loop filter 105.

Phase comparator 101, loop filter 105 and voltage-controlled oscillator 106 shown in FIG. 16 respectively perform processings equal to those performed by the similar constructional elements of FIG. 2.

IN the PLL circuit constructed above, both AND gates 131 and 132 constructing gate circuit 103 attain a closed state on the basis of the switch control signal in the period except for the period in which the data are read from the disk. Accordingly, output signals U, D from phase conparator 101 are disabled and the supply of these output signals to loop filter 105 is stopped.

Signal processing circuit 102 constructed by the DSP detects the difference in phase between the reference clock signal having a fixed frequency and the output clock signal from voltage-controlled oscillator 106, and outputs digital data based on a processing corresponding to this phase difference as described later. The output data signal from signal processing circuit 102 is converted to an analog voltage by D/A converter 104, and thereafter is supplied to inverted input terminal "—" of operational amplifier 157 constituting loop filter 105 to perform an adding operation therein. A reference voltage is supplied to non-inverted input terminal "+" of operational amplifier 157.

The above-mentioned signal processing circuit 102 performs a processing for making the phase of the output clock signal to follow the phase of the reference clock signal by controlling the output voltage of D/A converter 104 added to loop filter 105 on the basis of the difference in phase between the reference clock signal and the output clock signal. Namely, in the period except for the period in which the data are read from the disk, the output voltage of D/A converter 104 is controlled by signal processing circuit 102 and the frequency of the output clock1 signal is used as a reference frequency predetermined in advance and is held constantly by signal processing circuit 102.

The following case relates to a case in which the phase of the above-mentioned output clock signal is locked with the phase of the reference clock signal and the PLL circuit is operated on the basis of the reference frequency in the steady state.

In this case, the output voltage of loop filter 105 in this lock state is held to be an approximately constant voltage value such that the frequency of the output clock signal becomes the reference frequency. Further, in the above-mentioned lock state, the output of phase comparator 1 is in the disabled state on the basis of the switch control signal mentioned above.

Therefore, the output voltage of D/A converter 104 in the lock state has a voltage value so as to cancel the change in output voltage of loop filter 105 caused by an input bias electric current, etc., of operational amplifier 157 constituting loop filter 150.

Accordingly, when the average value of the output voltage of D/A converter 104 in the above-mentioned lock state is held, the output voltage from loop filter 105 is held to be an approximately constant value even when the read data are lost for a long period during the period in which the data are read from the disk, thereby solving the problems in the conventional PLL circuit.

In the above-mentioned PLL circuit of the present invention, the output of phase comparator 101 is in the disabled state based on the switch control signal until just before the required information is started to be read. Further, the frequency of the output clock signal generated from voltage-controlled oscillator 106 is used as the reference frequency and is held constantly by controlling the output voltage of D/A converter 104 supplied to loop filter 105 by signal processing circuit 102 constructed by the DSP.

During the information read period, AND gates 131, 132 constituting gate circuit 103 attain an open state on the basis of the switch control signal so that the output of phase comparator 101 attains an enabling state and is supplied to loop filter 105 and the average value just before the read period of the output data in signal processing circuit 102 is held.

In the above-mentioned data read period, even when there is a period in which the read data are lost, the output voltage of loop filter 105 is held to be the approximately constant voltage by the output voltage from D/A converter 104 based on the average value just before the read period of the output data held by signal processing circuit 102. Accordingly, the frequency of the output clock signal from voltage-controlled oscillator 106 can be held to the operating frequency that existed just before the data were lost.

Figure 17:
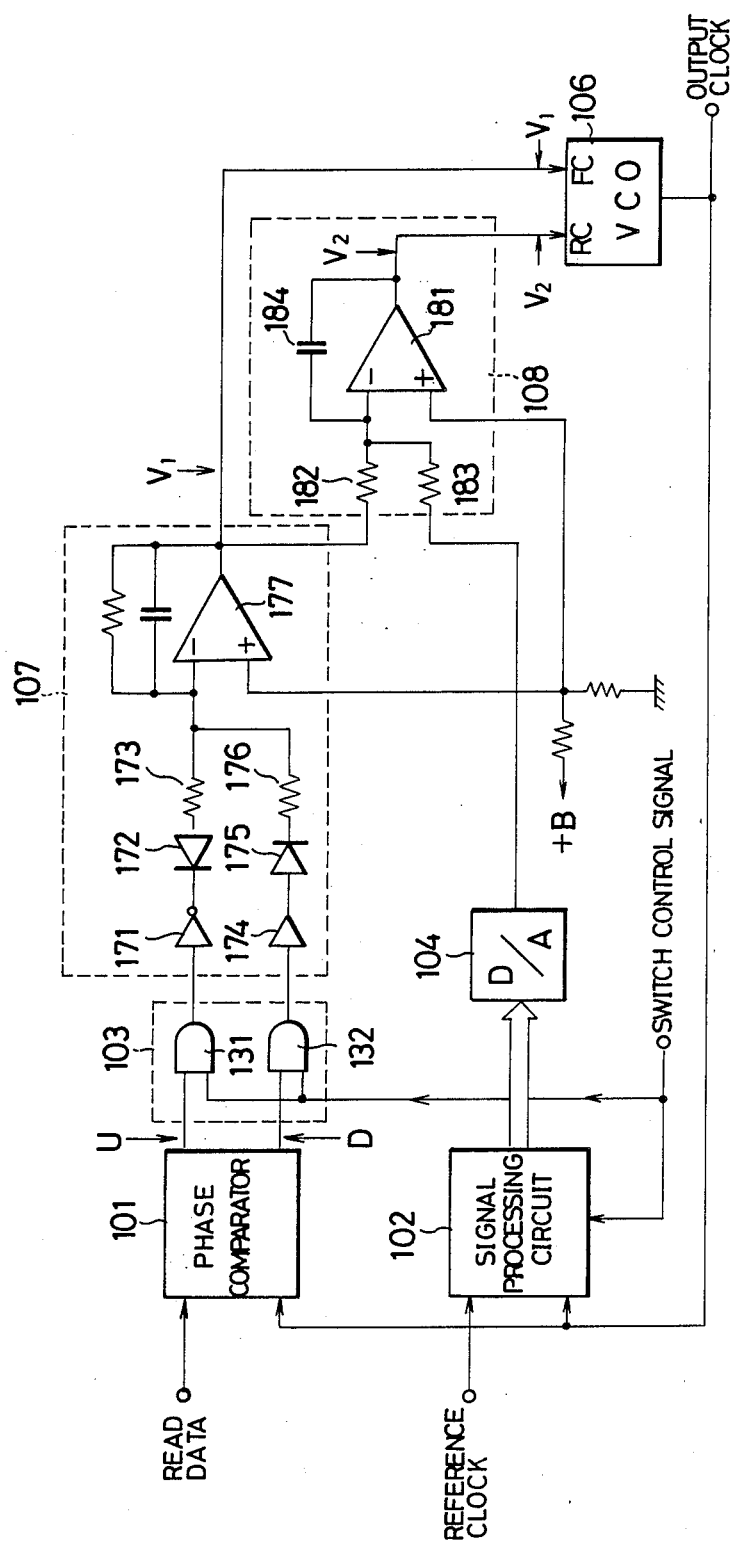
FIG. 17 is a constructional view of the PLL circuit in accordance with a third embodiment of the present invention.

FIG. 17 is a constructional view showing the PLL circuit in accordance with a third embodiment of the present invention.

In FIG. 17, phase comparator 101, processing circuit 102 constructed by a DSP, gate circuit 103 and D/A converter 104 respectively perform operations similar to those performed by the constructional elements designated by the same reference numerals in FIG. 16. Voltage-controlled oscillator 106 is constructedd as an oscillator having two inputs.

With respect to proportional circuit 107, during the period in which the data are read from the disk, output signal U is provided from phase comparator 101 through AND gate 131 of gate circuit 103, and is supplied to inverted input terminal "—" of operational amplifier 177 through inverter 171, diode 172 and resistor 173. Further, in this data read period, output signal D is provided from phase comparator 101 through AND gate 132, and is supplied to the inverted input terminal "—" of operational amplifier 177 through buffer 174, diode 175 and resistor 176. Operational amplifier 177 has non-inverted input terminal "+" to which a reference voltage is supplied. Proportional circuit 107 outputs voltage $V_1$ approximately proportional to the output voltage from phase comparator 101 through gate circuit 103 and this voltage $V_1$ is supplied to one input or FC terminal of voltage-controlled oscillator 106.

Integral circuit 108 is constructed by operational amplifier 181, resistor 182, 183 and capacitor 184. Voltage $V_1$ from proportional circuit 107 and the output voltage from D/A converter 104 are supplied to inverted input termminal "—" of operational amplifier 181. A reference voltage is supplied to non-inverted input terminal "+" of operational amplifier 181. Integral circuit 108 outputs voltage $V_2$ approximately proportional to an integral value of an added output provided by adding output voltage $V_1$ from proportional circuit 107 and the output voltage from D/A converter 104. This voltage $V_2$ is supplied to the other input or RC terminal of voltage-controlled oscillator 106.

The above-mentioned voltage-controlled oscillator 106 having two inputs may be constructed by each of products of serial numbers SN74LS624, 628, 629, etc., manufactured by Texas Instruments corporation. Output voltage $V_1$ from proportional circuit 107 is supplied to the FC terminal of the above voltage-controlled oscillator 106, and output voltage $V_2$ from integral circuit 108 is supplied to the RC terminal of voltage-controlled oscillator 106 so that voltage-controlled oscillator 106 generates and outputs an output clock signal having a frequency controlled by voltages $V_1$, $V_2$.

The output voltage supplied to integral circuit 108 from D/A converter 104 controlled by signal processing circuit 102 totally cancels the change in input offset voltage of operational amplifier 177 constituting proportional circuit 107, the change in output offset voltage caused by an input bias electric current, etc., and the change in output voltage of integral circuit 108 caused during the period in which the read data are lost, or caused by the input bias electric current, etc., of operational amplifier 181 constituting integral circuit 108. Thus, effects similar to those in the second embodiment of the present invention can be obtained.

Figure 18:
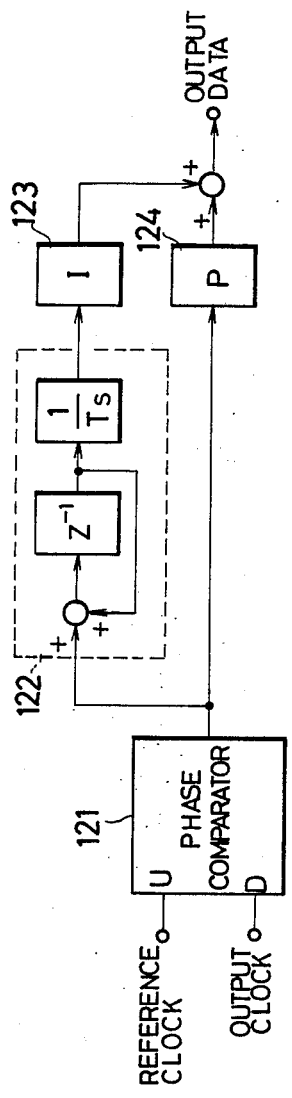
FIG. 18 is a view showing one constituting a signal processing circuit in the present invention.

FIG. 18 shows one construction of the DSP constituting signal processing circuit 102 in the above-mentioned second and third embodiments of the present invention.

In FIG. 18, phase comparator 121 detects the difference in phase between a reference clock signal having a fixed reference frequency and the output clock signal from voltage-controlled oscillator 106. In this embodiment, phase comparator 121 is constructed by a reversible counter for performing a count-up operation and a count-down operation by the reference clock signal and the output clock signal, respectively. Phase comparator 121 detects the difference in phase between the above reference clock and output clock signals in a plurality of synchronizations, and the counted value outputted from this phase comparator shows the difference in phase therebetween.

Integrator 122 has a transfer element shown by $Z^{-1}$ in FIG. 18 as a delay element which is constructed by a register, etc., in the real circuit. The block shown by broken line of this figure and including this delay element is operated as this integrator and has transfer characteristics equal to those of integral element $1/S$ in a continuous linear system where S is a Laplace operator.

Reference numeral $T_S$ within integrator 122 shows a delay time of the delay element, i.e., a sampling time in the digital signal processing circiut.

In the construction shown in FIG. 18, an integral component is provided through integrator 122 on the basis of the difference in phase between the reference clock signal and the output clock signal supplied to phase comparator 121. This integral component and a proportional component proportional to the output of phase comparator 121 are respectively multiplied, as coefficients, by integral elements I shown by reference numeral 123 and proportional element P shown by reference numeral 124. The multiplied integral and proportional components are added to each other and are provided to D/A converter 104 as output data.

Figure 19:
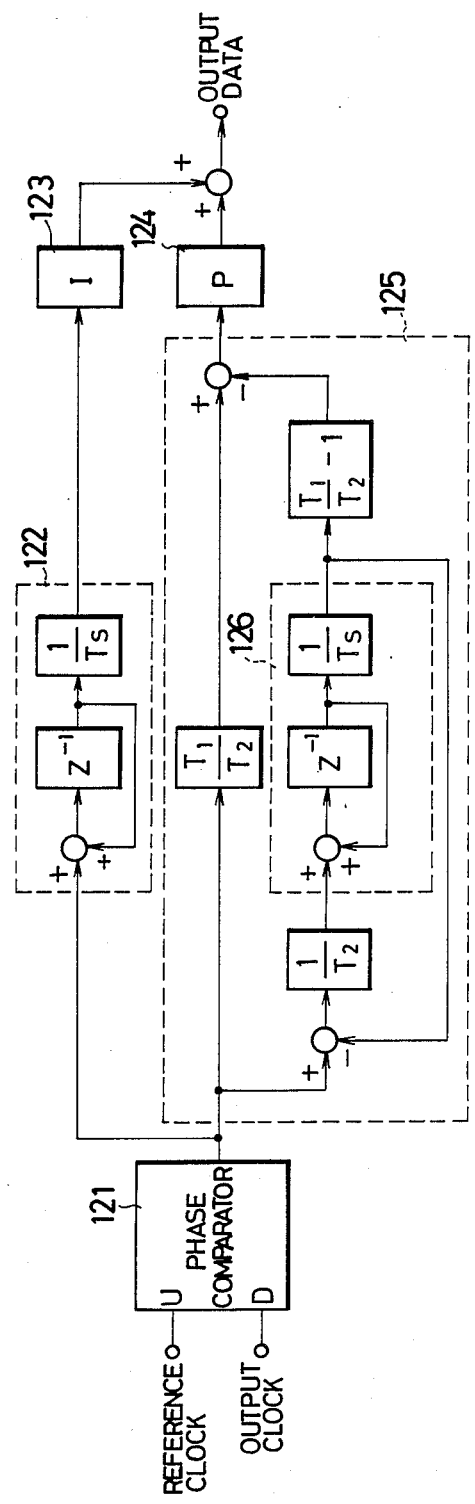
FIG. 19 is a view showing another constructional example of the above digital signal processor.

FIG. 19 shows another constructional embodiment of the above DSP.

In the third embodiment of the present invention shown in FIG. 17, the transfer function for providing the phase of the output clock signal generated by voltage-controlled oscillator 106 from the output voltage of D/A converter 104 constitutes a double integral system. Therefore, as seen from the constructional embodiment of the DSP in FIG. 18, it is difficult to make the phase of the stable output clock signal to follow the phase of the reference clock signal in the processing system for outputting only the integral and proportional components based on the difference in phase between the reference clock and output clock signals.

The circuit embodiment shown in FIG. 19 is constructed to improve the stability in phase by compensating the advance of phase using lead lag filter 125.

The block of integrator 126 constituting lead lag filter 125 is replaced by integral element $1/S$ in the continuous linear system so that this block becomes equivalent to that having the following transfer function $$\frac{T_1 S + 1}{T_2 S + 1}.$$

In the following case, it is assumed that the output voltage of D/A converter 104 is controlled by signal processing circuit 102 and the phase of the output clock signal from voltage-controlled oscillator 106 is locked with the phase of the reference clock signal and the circuitry is operated at the reference frequency in the steady state.

In this case, the transfer function for providing the phase of the output clock signal from the output voltage of D/A converter 104 in the second and third embodiments shown in FIGS. 16 and 17 is of a 2-type. Further, the transfer function of the DSP in the construction shown in FIGS. 18 and 19 is of a 1-type. The transfer function of the entire system is of a 3-type. Accordingly, the steady difference in phase becomes 0.

Here, transfer function G(S) in called an n-type when $$\lim_{S \to 0} S^n$$

G(S) is not zero but becomes a finite value.

Accordingly, in the above-mentioned steady state, the average output data of the DSP are occupied by the integral component and the proportional component or the output component of the above-mentioned lead lag filter 125 are changed only in the vicinity of value 0.

As a result, even in the period in which the data are read from the disk, the average value of the output data just before the data read period can be held by controlling the circuitry such that the output of the integrator of signal processing circuit 102 just before the above data read period is held on the basis of the above-mentioned switch control signal, and the above proportional component or the output component of the lead lag filter becomes 0, although this control state is not shown in FIGS. 18 and 19.

The construction of signal processing circuit 102 in the present invention is not limited to that of the DSP shown in FIGS. 18 and 19, but may be a construction for controlling the output voltage of D/A converter 104 so as to make the phase of the output clock signal to follow the phase of the reference clock signal based on the difference in phase between the reference clock and output clock signals, thereby holding the average output data just before the data read period by the switch control signal.

As mentioned above, in accordance with the present invention, in a period except for the period in which the data are read from the disk, the output signal from the phase comparator is in the disabled state and the frequency of the output clock signal from the voltage-controlled oscillator is stabilized on the basis of a voltage corresponding to the difference in phase between the output clock signal and the reference clock signal having a fixed reference frequency. Accordingly, the frequency of the output clock signal during the period in which the read data are lost can be prevented from being varied and can be used as the reference frequency and can be constantly held.

Many widely different embodiments of the present invention may be constructed without departing from the spirit and scope of the present invention. It should be understood that the present invention is not limited to the specific embodiments described in the specification, except as defined in the appended claims.

What is claimed is:

1. A phase loop (PLL) circuit comprising:
   phase comparing means for receiving an input signal and an output clock signal, detecting a difference in phase between these two signals, and outputting a first signal according to said phase difference;
   proportional means for converting said first signal to a first voltage having an amplitude proportional to said phase difference;
   integral means for converting said first signal to a second voltage having an amplitude proportional to an integral value of said phase difference; and
   voltage-controlled oscillating meands for receiving said first and second voltages and generating said output clock signal having a frequency controlled by said first and second voltages,
   a frequency $F_0$ of said output clock signal being represented by the following formula, $$F_0 = \frac{1}{a} \frac{V_1 + b}{V_2 + c}$$

where said first and second voltages are respectively designated by $V_1$ and $V_2$, and the values, a, b, and c are constants.

2. A phase locked loop (PLL) circuit comprising:
   phase comparing means for receiving an input signal and an output clock signal, detecting a first difference in phase between these two signals, and outputting a first signal corresponding to said first phase difference;
   signal processing means for detecting a second difference in phase between said output clock signal and a reference clock signal having a predetermined frequency, outputting a second signal corresponding to said second phase difference while said PLL circuit is in a first state where no input signals are received by said phase comparing means, and outputting a third signal while said PLL circuit is in a second state where input signals are received by said phase comparing means, said third signal having a magnitude equal to an average value of the second signal outputted for a predetermined period just before said PLL circuit is changed to be in said second state from said first state;
   filter means for outputting a voltage signal corresponding to said second signal when said PLL circuit is in said first state, corresponding to a sum of said first signal and said third signal when said PLL circuit is in said second state; and
   voltage-controlled oscillating means for generating said output clock signal having a frequency corresponding to said voltage siganl.

3. A PLL circuit according to claim 2, in which said filter means has a characteristic of integrating an input signal in a low-frequency range.

4. A PLL circuit according to claim 2, in which said signal processing means is provided with a digital-to-analog converter at an output thereof.

5. A PLL circuit according to claim 2, in which said phase comparing means is provided with gate means which allows the first signal to pass to said filter means when said PLL circuit is in said second state.

6. A phase locked loop (PLL) circuit comprising:
   phase comparing means for receiving an input signal and an output clock signal, detecting a first difference in phase between these two signals, and outputting a first signal corresponding to said first phase difference;
   proportional means for converting the first signal to a first voltage signal having an amplitude proportional to said phase difference;
   signal processing means for detecting a second difference in phase between said output clock signal and a reference clock signal having a predetermined frequency, outputting a second signal corresponding to said second phase difference while said PLL circuit is in a first state where on input signals are received by said phase comparing means, and outputting a third signal while said PLL circuit is in a second state where input signals are received by said phase comparing means, said third signal having a magnitude equal to an average value of the second signal outputted for a predetermined period just before said PLL circuit is changed to be in said second state from said first state;
   integral means for integrating said second signal thereby producing a second voltage when said PLL circuit is in said first state and integrating a sum of said first signal and said third signal thereby producing a third voltage signal; and voltage-controlled oscillating means for receiving said first, second and third voltage signals and for generating said output clock signal having a frequency corresponding to said first and second voltage signals or said first and third voltage signals.

7. A PLL circuit according to claim 6, in which said signal processing means is provided with a digital-to-analog converter at an output thereof.

8. A PLL circuit according to claim 6, in which said phase comparing means is provided with gate means which allows the first signal to pass to said proportional means when said PLL circuit is in said second state.

* * * * *

UNITED STATES PATENT AND TRADEMARK OFFICE
CERTIFICATE OF CORRECTION

PATENT NO. : 4,942,370
DATED : July 17, 1990
INVENTOR(S) : Toshihiro SHIGEMORE

It is certified that error appears in the above-identified patent and that said Letters Patent is hereby corrected as shown below:

Cover page, left-hand column, under Foreign Application Priority Data, section [30], line 2, change "Jun. 23, 1988 [JP] Japan....53-153494" to --Jun. 23, 1988 [JP] Japan....63-153494--.

Signed and Sealed this

Tenth Day of August, 1993

Attest:

MICHAEL K. KIRK

Attesting Officer

Acting Commissioner of Patents and Trademarks